(12) United States Patent
Kyriazidou et al.

(10) Patent No.: US 7,236,080 B2
(45) Date of Patent: Jun. 26, 2007

(54) ON-CHIP HIGH Q INDUCTOR

(75) Inventors: Sissy Kyriazidou, Santa Monica, CA (US); Harry Contopanagos, Santa Monica, CA (US); Reza Rofougaran, Marina Del Ray, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/944,305

(22) Filed: Sep. 17, 2004

(65) Prior Publication Data

US 2005/0030145 A1    Feb. 10, 2005

Related U.S. Application Data

(63) Continuation of application No. 10/087,614, filed on Mar. 1, 2002, now Pat. No. 6,809,623.

(51) Int. Cl.
*H01F 5/00* (2006.01)
*H03H 5/00* (2006.01)
(52) U.S. Cl. .......................... 336/200; 336/232; 333/25
(58) Field of Classification Search ................ 336/200, 336/223, 232; 333/25–26
See application file for complete search history.

(56) References Cited

U.S. PATENT DOCUMENTS

| 6,396,362 B1 * | 5/2002 | Mourant et al. ............... 333/25 |
| 6,420,773 B1 * | 7/2002 | Liou ........................... 257/531 |
| 6,429,504 B1 * | 8/2002 | Beaussart et al. ........... 257/531 |
| 6,501,363 B1 * | 12/2002 | Hwu et al. ................... 336/200 |
| 6,566,731 B2 * | 5/2003 | Ahn et al. ................... 257/531 |
| 6,603,383 B2 * | 8/2003 | Gevorgian et al. .......... 336/200 |
| 2002/0093414 A1 * | 7/2002 | Wong et al. ................. 336/200 |

OTHER PUBLICATIONS

Pieters et al. "High-Q Integrated Spiral Inductors for High Performance Wireless Front-End Systems" 2000 IEEE.*
Zolfaghari et al., "Stacked Inductors and 1-to-2 Transformers in CMOS Technology", IEEE 2000 Custom Integrated Circuits Conference.*
Papananos et al , "Efficient Utilization of On-Chip Inductors in Silicon RF IC Design Using a Novel CAD Tool; The LNA Paradigm", 1998 IEEE.*

* cited by examiner

*Primary Examiner*—Anh Mai
(74) *Attorney, Agent, or Firm*—Garlick Harrison & Markison; Timothy W. Markison; Bruce E. Stuckman (57) ABSTRACT

A high-Q on-chip inductor includes a primary winding and an auxiliary winding. The primary winding includes a first node and a second node. The auxiliary winding is operably coupled to increase a quality factor of the primary winding.

7 Claims, 7 Drawing Sheets high-Q on-chip inductor 10

FIG. 1
high-Q on-chip inductor 10

FIG. 3A TOP VIEW

FIG. 3B SIDE VIEW

FIG. 6A
TOP VIEW

FIG. 6B
SIDE VIEW

FIG. 7

ON-CHIP HIGH Q INDUCTOR

This patent is claiming priority under 35 USC § 120 as a continuation patent application to patent application entitled HIGH Q ON-CHIP INDUCTOR AND METHOD OF MANUFACTURE THEREOF, having a serial number of Ser. No. 10/087,614, and a filing date of Mar. 1, 2002 now U.S. Pat. No. 6,809,623.

TECHNICAL FIELD OF THE INVENTION

This invention relates generally to integrated circuits and more particularly to on-chip inductors.

BACKGROUND OF THE INVENTION

As is known, wireless communications standards place stringent requirements on a wireless communication device's dynamic range of operation because the signal strength of received signals may vary by many orders of magnitude. To meet these requirements, wireless communication devices are designed using radio frequency (RF) integrated circuits (IC) that consume low power and produce little noise. As is also known, on-chip inductors are significant components of RF integrated circuits and are used in oscillators, impedance matching networks, emitter degeneration circuits, filters, and/or baluns. Thus, it is desirable to use on-chip inductors that consume as little power as possible and produce as little noise as possible.

As is further known, inductor performance is expressed as a quality factor (Q-factor), which is associated with the resonance of the inductor and describes both the ability of the inductor to produce a large output at the resonant frequency and the selectivity (i.e., the power ratio in decibels versus frequency) of the inductor. As such, the Q-factor is a key component in determining power dissipation and phase noise of integrated circuits. In general, inductors having a high Q-factor dissipate less power and thus improve the achievable gain. Further, high Q inductors allow an oscillating circuit to perform with minimal power injection from the driving transistor and hence minimize noise.

In addition, high Q inductors minimize the power leaking into adjacent channels that corrupts a receiver performance in nearby channels of communication chips, which degrade a receiver's sensitivity. Furthermore, higher dynamic range of wireless communication devices is obtained due to the intrinsic linearity of passive devices.

Not surprisingly, high Q inductors are a key element for RF integrated circuits to have low power consumption and to achieve the desired noise performance. While performance of wireless communication devices is a critical design issue it is typically balanced with manufacturing costs of the devices.

As is known, CMOS technology is widely used for cost effective fabrication of integrated circuits, including RF integrated circuits. However, on-chip inductors using CMOS technology are known to have a modest quality factor in the range of 5 to 10, which limit their usefulness in applications that require a high Q inductor, including some wireless communication applications.

Therefore, needs exist for a high quality factor on-chip inductor for use in many applications including wireless communication applications.

SUMMARY OF THE INVENTION

The high Q on-chip inductor of the present invention substantially meets these needs and others. In one embodiment, a high-Q on-chip inductor includes a primary winding and an auxiliary winding. The primary winding includes a first node and a second node. The auxiliary winding is operably coupled to increase a quality factor of the primary winding.

DETAIL DESCRIPTION OF A PREFERRED EMBODIMENT

Figure 1:
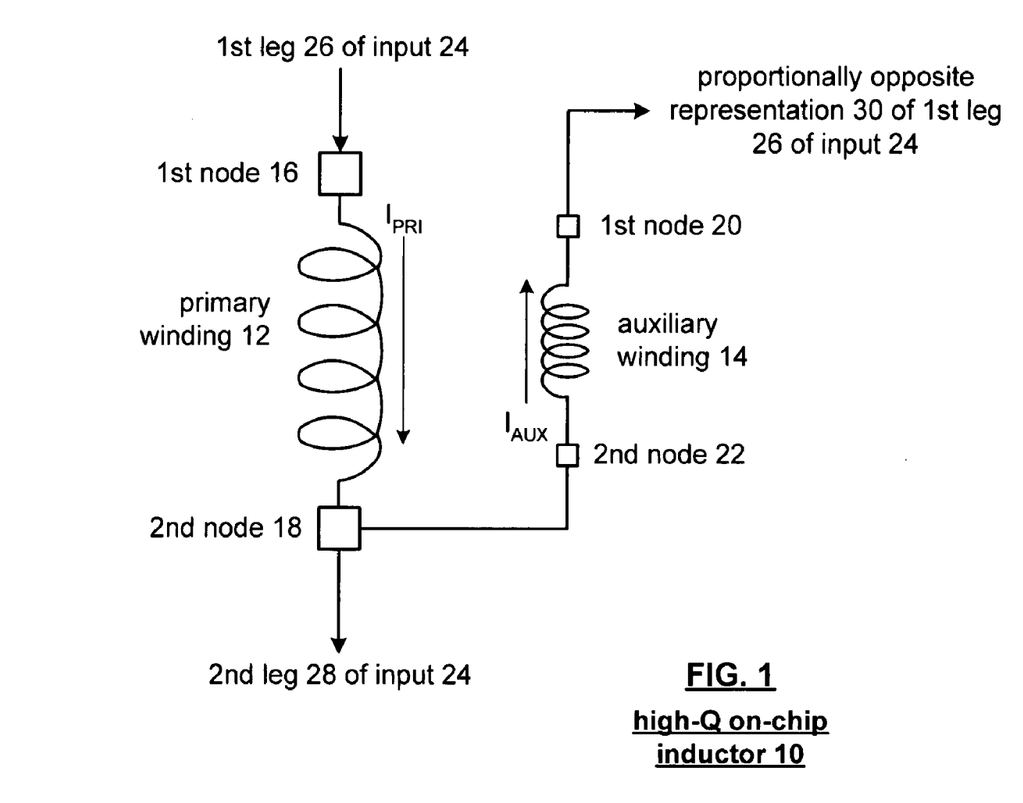
FIG. 1 illustrates a schematic block diagram of a high Q on-chip inductor in accordance with the present invention.

FIG. 1 illustrates a schematic block diagram of a high Q (i.e., quality factor) on-chip inductor 10 that includes a primary winding 12 and an auxiliary winding 14, which may be fabricated using CMOS technology, gallium arsenide technology, silicon germanium technology, or any other type of integrated circuit technology. The primary winding 12 includes a $1^{st}$ node 16 and a $2^{nd}$ node 18. The auxiliary winding 14 includes a $1^{st}$ node 20 and a $2^{nd}$ node 22. As shown, the $2^{nd}$ node 18 of primary winding 12 is coupled to the $2^{nd}$ node 22 of the auxiliary winding 14. The $1^{st}$ node 16 and $2^{nd}$ node 18 of primary winding 12 are operably coupled to receive a $1^{st}$ leg 26 and $2^{nd}$ leg 28 of an input 24, respectively. As such, a current ($I_{PRI}$) flows through the primary winding 12 based on the magnitude of the input 24 imposed across the $1^{st}$ node 16 and $2^{nd}$ node 18 and the inductance value of the primary winding. As one of average skill in the art will appreciate, the input 24 may be a voltage input or a current input.

The $1^{st}$ node 20 of auxiliary winding 14 is operably coupled to receive a proportionally opposite representation 30 of the $1^{st}$ leg 26 of input 24 (i.e., is reversed biased with respect to the primary winding). As such, the auxiliary winding 14 has a current ($I_{AUX}$) that is proportionally opposite to the current through the primary winding 12. If the proportionally opposite representation 30 is of the same magnitude as the $1^{st}$ leg of input 24 and the auxiliary winding 14 includes the same number of turns as primary winding 12, the auxiliary current will have the same magnitude as the primary current. As one of average skill in the art will appreciate, by scaling the magnitude of the proportionally opposite representation 30 and/or by changing the number of turns in the auxiliary winding 14 with respect to the number of turns in primary winding 12, the auxiliary current may be greater than or less than the primary current.

As configured, the auxiliary winding 14 is asymmetrical with respect to the primary winding 12 and has a greater real part admittance (i.e., the inverse of impedance of the winding at an operating frequency) than the real part of the admittance of the primary winding 12. The asymmetry between the primary winding 12 and auxiliary winding 14 may be achieved by one or more of: asymmetrical electromagnetic coupling between the primary winding and auxiliary winding; an asymmetrical number of turns between the primary winding and auxiliary winding; an asymmetrical geometric configuration of the primary and auxiliary windings.

The admittances of both the primary winding 12 and auxiliary winding 14 include self-admittance and coupled-admittance. The magnitude of the admittances is dependent on the proximal location of the auxiliary winding to the primary winding and the asymmetry between the windings. Accordingly, the more closely coupled the auxiliary winding 14 is to the primary winding 12 and the more asymmetrical the windings are, the greater the difference will be in the real parts of the admittances of the primary winding 12 and the auxiliary winding 14. Such a difference effectively decreases the real part of the primary winding's admittance at an operating frequency (e.g., 2.5 gigahertz to 6 gigahertz), which increases the quality factor of the primary winding. For example, the primary winding 12 may have a quality factor of at least 30 using CMOS technology.

As one of average skill in the art will appreciate, the high quality factor on-chip inductor 10 may be a differential inductor having an imbalanced differential input, wherein one half of the differential inductor functions as the primary winding and the other half functions as the auxiliary winding.

Figure 2A:
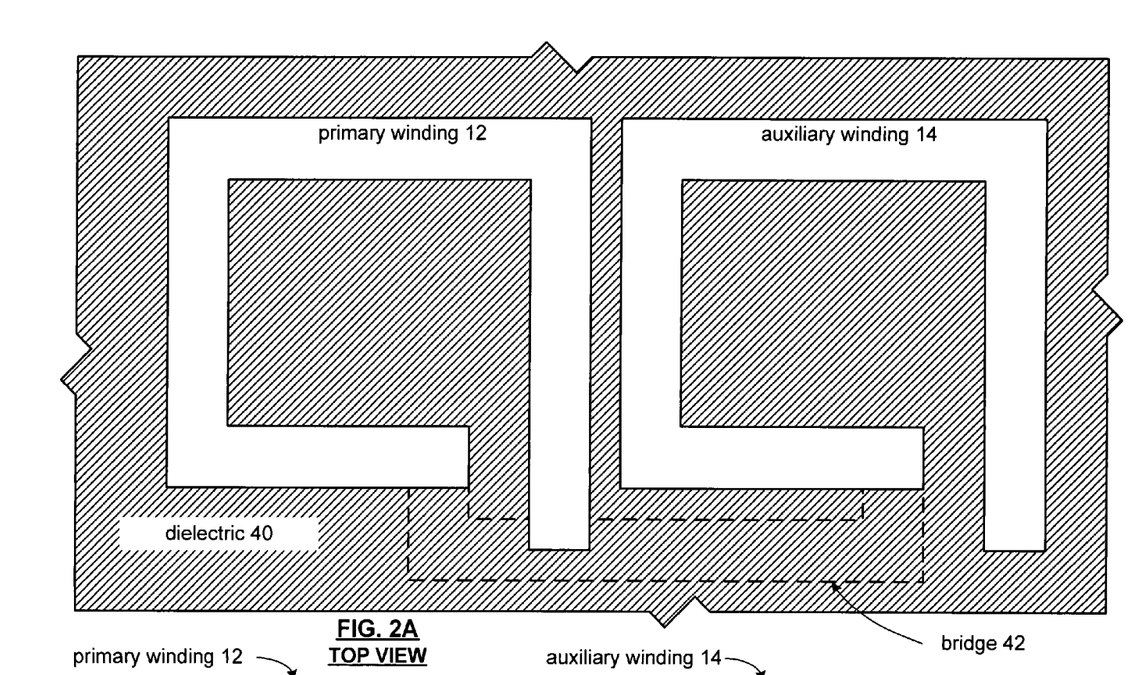
FIGS. 2A and 2B illustrate a top and side view of an on-chip inductor in accordance with the present invention.
Figure 2B:
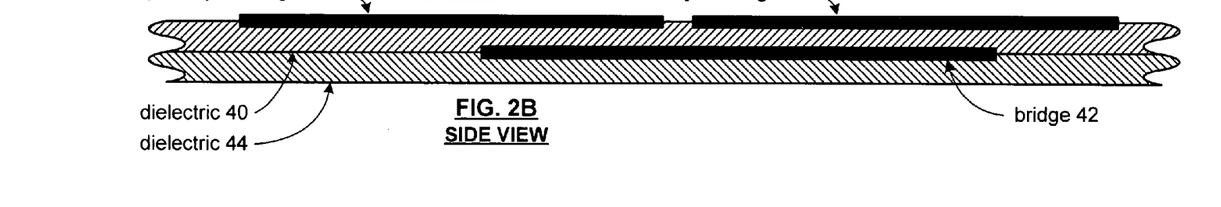

FIGS. 2A and 2B illustrate a top and side view of the high Q on-chip inductor 10. As shown, the primary winding 12 and auxiliary winding 14 are deposited and/or etched on dielectric layer 40. The $2^{nd}$ node of primary winding 12 is operably coupled to the $2^{nd}$ node of auxiliary winding 14 via a bridge 42. The bridge may be formed on a $2^{nd}$ dielectric layer 44. In this configuration, the asymmetrical coupling of the auxiliary winding 14 to the primary winding 12 creates at least a part of the asymmetry between the admittance of the windings 12 and 14.

Figure 3A:
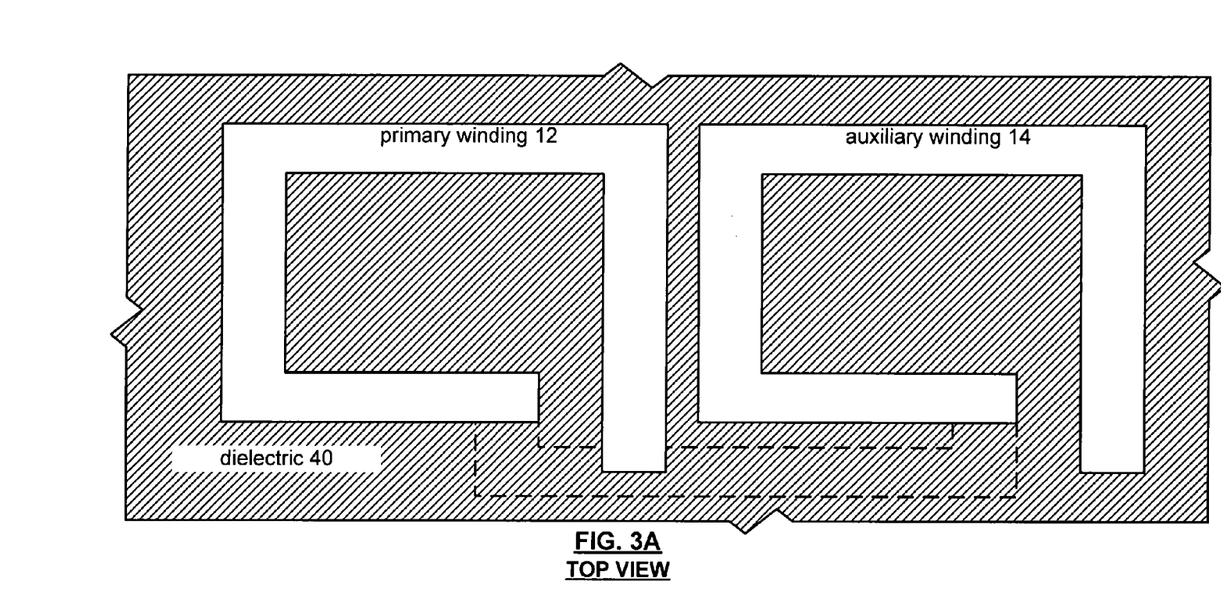
FIGS. 3A and 3B illustrate a top and side view of an altering embodiment of an on-chip inductor in accordance with the present invention.
Figure 3B:
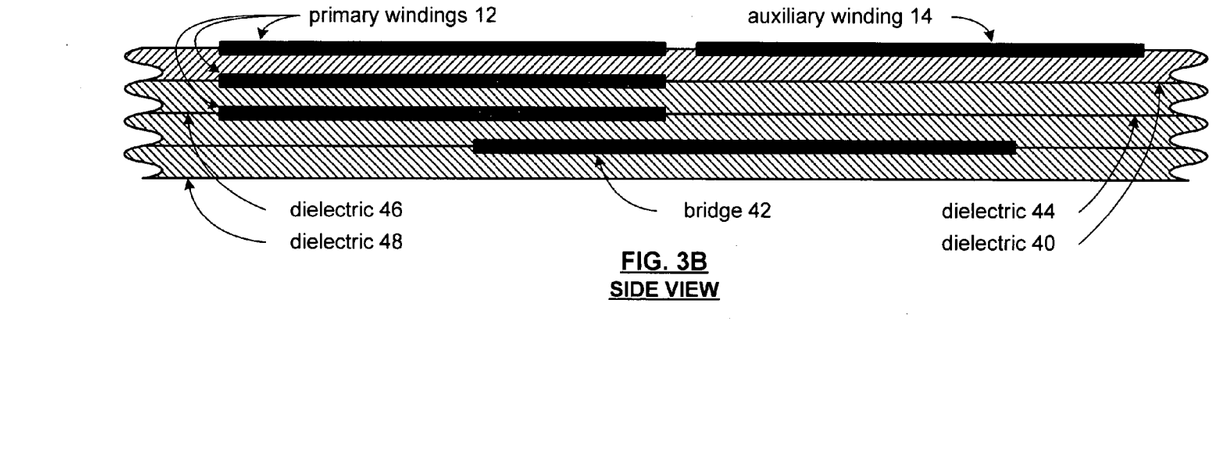

FIGS. 3A and 3B illustrate a top and side view of a high Q on-chip inductor that includes a multi-layered and multi-winding primary winding 12 and auxiliary winding 14. As shown in this configuration, the primary winding 12 includes a plurality of windings, which may have one or more turns, on multiple dielectric layers. As shown, the primary winding includes three layers of one turn, on dielectric layer 40, dielectric layer 44 and dielectric layer 46. Dielectric layer 48 supports bridge 42, which couples the primary winding 12 to auxiliary winding 14. In this instance, the asymmetry is generated not only by reversed biased electromagnetic coupling but also by an asymmetry in the number of turns between the primary and secondary windings. As one of average skill in the art will appreciate, the primary winding 12 may have one or more turns on each of the dielectric layers. In addition, the number of dielectric layers and/or turns may vary from those illustrated in FIGS. 3A and 3B.

Figures 4A, 4B, 4C:
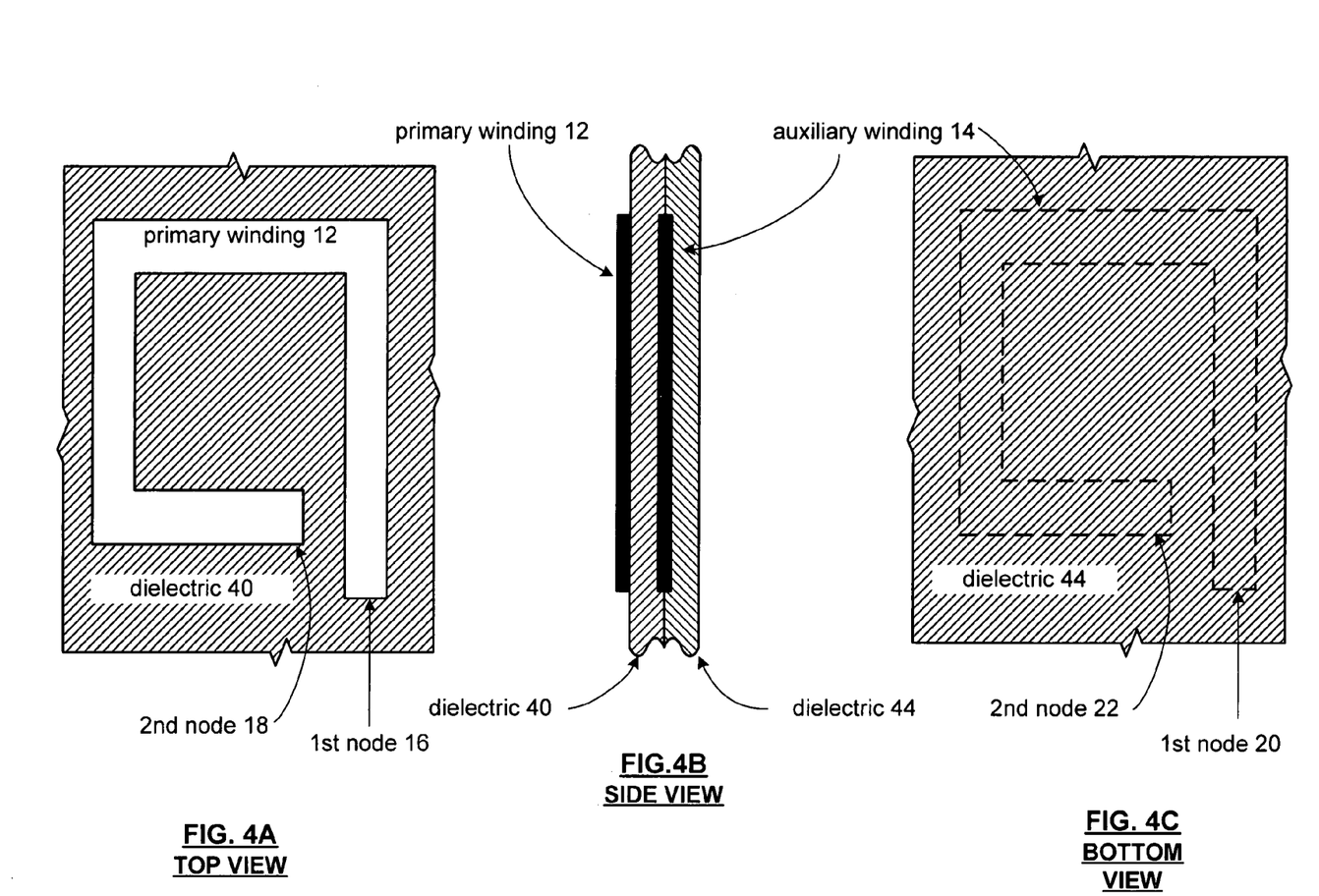
FIGS. 4A, 4B and 4C illustrate another embodiment of an on-chip inductor in accordance with the present invention.

FIGS. 4A, B, and C illustrate an alternate embodiment of an on-chip inductor that includes the primary winding 12 on dielectric layer 40 and auxiliary winding 14 on a $2^{nd}$ dielectric layer 44. In this instance, the electromagnetic coupling between the auxiliary winding 14 and primary winding 12 is increased. Such an increase in reverse biased electromagnetic coupling, increases the asymmetry, and thus increases the quality factor of primary winding 12. Note that the primary winding 12 and auxiliary winding 14 may each include one or more turns and may be implemented on one or more layers.

Figures 5A, 5B, 5C:
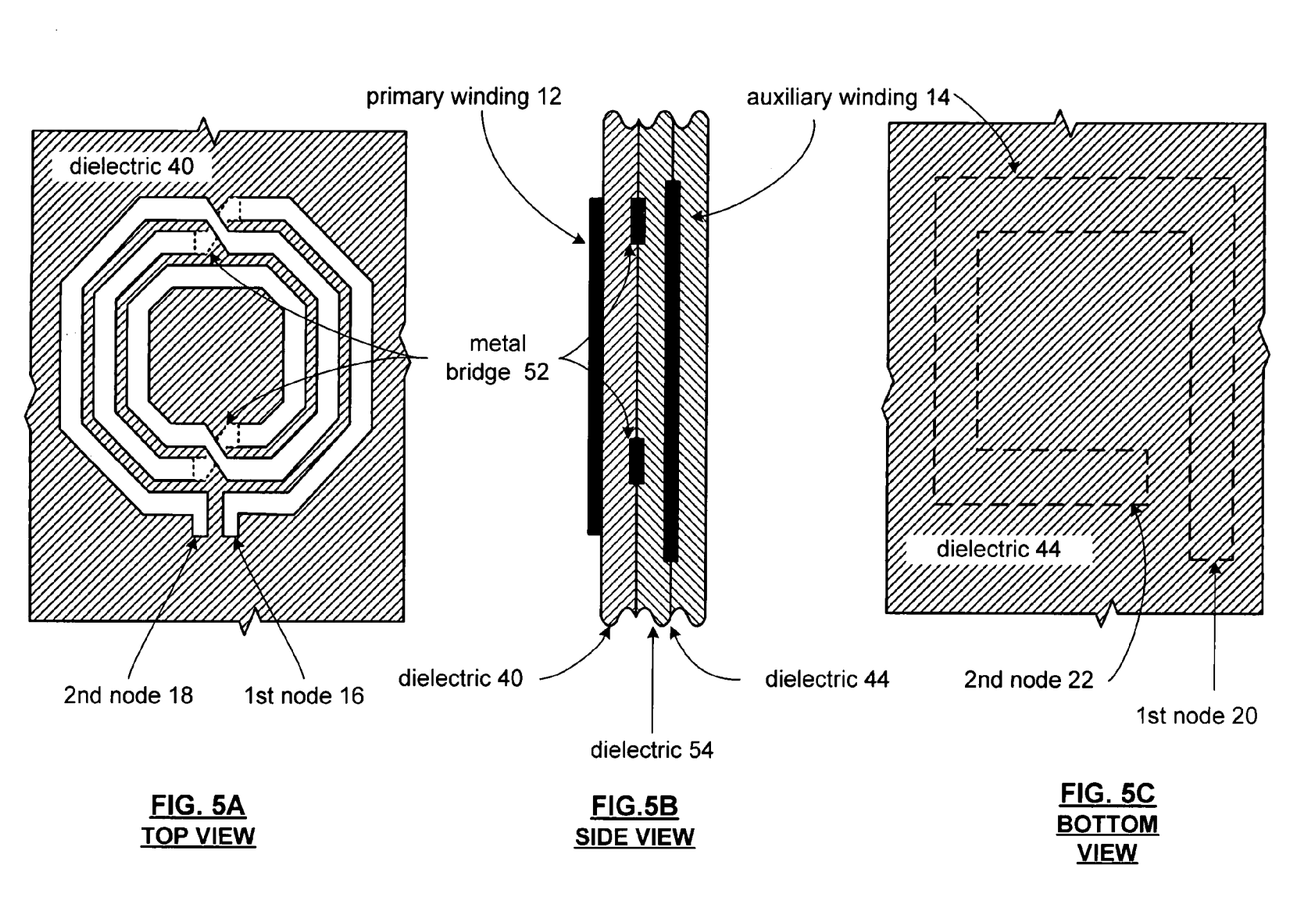
FIGS. 5A, 5B and 5C illustrate yet another embodiment of an on-chip inductor in accordance with the present invention.

FIGS. 5A through 5C illustrate a top, side and bottom view of another alternate embodiment of a high Q on-chip inductor. In this illustration, the primary winding 12 includes multiple turns on dielectric layer 40. On dielectric layer 54, metal bridges 52 are placed to provide coupling within the primary winding 12. The auxiliary winding 14 is on dielectric layer 44. As such, the asymmetry is at least partially achieved via the differing number of turns as well as the reversed biased electromagnetic coupling. As one of average skill in the art will appreciate, the primary winding may include more or less turns than shown in FIG. 5A and may be included on one or more layers. In addition, the auxiliary winding 14 may include more than one turn and may be implemented on more than one dielectric layer.

Figure 6A:
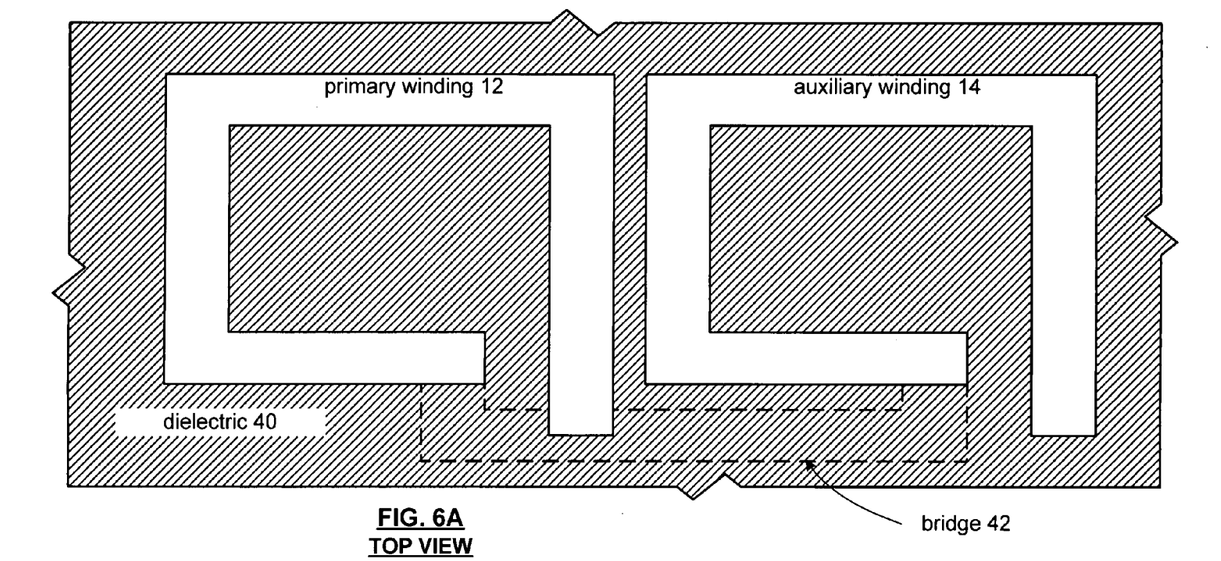
FIGS. 6A and 6B illustrate a further embodiment of an on-chip inductor in accordance with the present invention.
Figure 6B:
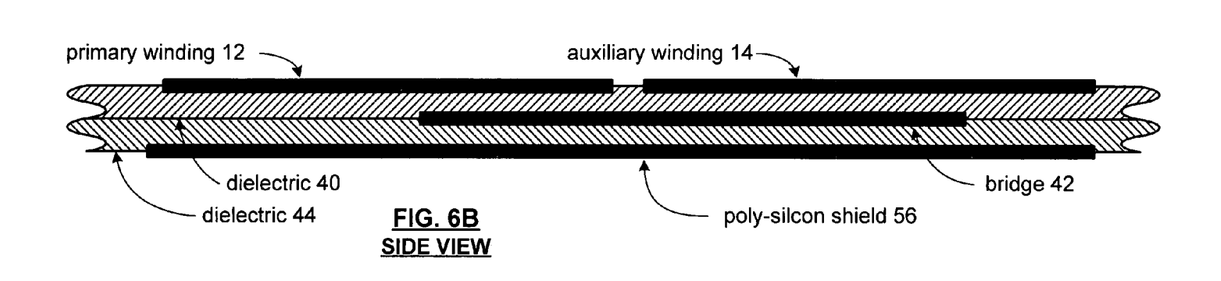

FIGS. 6A and 6B illustrate yet another alternate embodiment of a high Q on-chip inductor. In this embodiment, the primary winding 12 and auxiliary winding 14 are on dielectric layer 40. The bridge 42 connects the primary winding 12 to the auxiliary winding 14. In this embodiment, underneath dielectric layer 44 is a poly-silicon shield 56. The poly-silicon shield 56 is configured in a stacked geometry and further increases the quality factor. For example, in one embodiment of an on-chip inductor using CMOS technology, the quality factor may be increased to as much as 150. As one of average skill in the art will appreciate, the number of turns of the primary windings 12 and of the auxiliary windings 14 may vary from the one turn as shown in FIGS. 6A and 6B. In addition, the number of layers used to implement the primary winding 12 and/or auxiliary winding 14 may vary from the one shown in FIGS. 6A and 6B.

Figure 7:
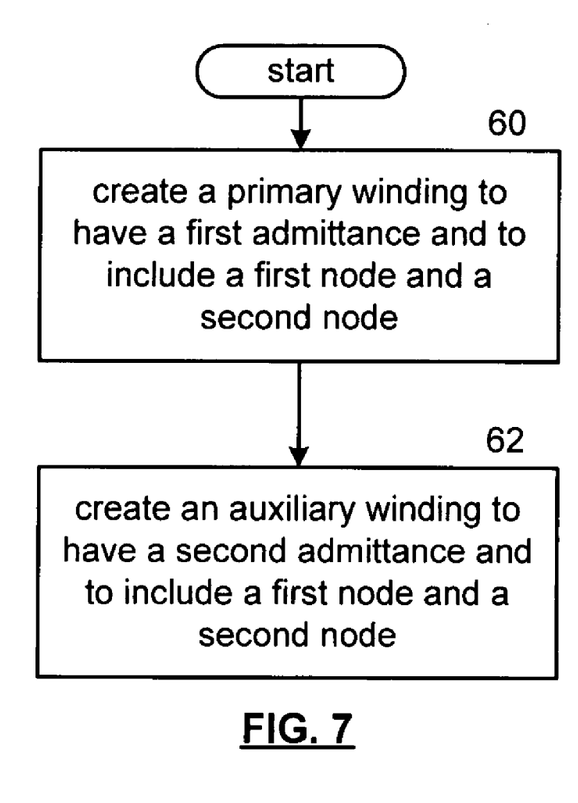
FIG. 7 illustrates a logic diagram of a method for manufacturing an on-chip inductor in accordance with the present invention.

FIG. 7 illustrates a logic diagram of a method of manufacturing a high quality on-chip inductor. The process begins at Step 60 where a primary winding is created to have a $1^{st}$ admittance and to include a $1^{st}$ and $2^{nd}$ node on a dielectric layer. The creation of the primary winding may be done by depositing, etching and/or any other method for obtaining a metal layer on a dielectric layer in an integrated circuit fabrication process. The process then proceeds to Step 62 where auxiliary winding is created to have a $2^{nd}$ admittance and to include a $1^{st}$ and $2^{nd}$ node. The $2^{nd}$ node of the primary winding is coupled to the $2^{nd}$ node of the auxiliary winding. In addition, the creation of the real part of the $2^{nd}$ admittance is done to be greater than the real part of the admittance of the primary winding. The primary winding is operably coupled to receive an input, while the auxiliary winding is operably coupled to receive a proportionally opposite representation of the input.

The admittance of the primary winding includes both self-admittance and coupled-admittance. Similarly, the admittance of the auxiliary winding includes self-admittance and coupled-admittance. The difference in the real parts of the admittance of both windings is dependent on the proximal location of the auxiliary winding to the primary winding and the asymmetry between the windings. The greater the coupling and asymmetry between the auxiliary winding and primary winding, the lower the real portion of the primary winding admittance will be, thus increasing the quality factor for the primary winding.

The asymmetry between the auxiliary winding the primary winding may be done by asymmetrical electrical coupling between the primary winding and auxiliary winding, differing number of turns in the primary winding versus the number of turns in the auxiliary winding, and/or by creating the primary winding to have a different geometric configuration than that of the auxiliary winding.

The quality factor of the primary winding may be enhanced by creating a poly-silicon shield that is operably coupled to the primary winding and the auxiliary winding. As one of average skill in the art will appreciate, the primary winding and/or auxiliary winding may be created to have multiple turns on multiple layers and/or a single turn on a single layer and/or any combination thereof.

The preceding discussion has presented a high quality on-chip inductor. Such a high quality on-chip inductor dramatically increases the quality factor of inductors thus making it very applicable for a wide variety of circuit applications including radio frequency integrated circuits, on-chip filters, et cetera. As one of average skill in the art will appreciate, other embodiments may be derived from the teachings of the present invention, without deviating from the scope of the claims.

What is claimed is:

1. A high-Q on-chip inductor comprises:
   primary winding including a first node and a second node, wherein the first node receives an first input signal; and
   auxiliary winding operably coupled to the primary winding to increase a quality factor of the primary winding, wherein the auxiliary winding receives a second input signal that is a proportionally opposite representation of the first input signal and produces therefrom an auxiliary current that is proportionally opposite of a current of the primary winding;
   wherein the first input signal and the second input signal each comprise one of a voltage input and a current input.

2. The high-Q onchip inductor of claim 1, wherein the auxiliary winding is proximally located to, and reversed biased with respect to, the primary, winding to at least partially establish an admittance of the auxiliary winding to be greater than an admittance of the primary winding.

3. The high-Q on-chip inductor of claim 1, wherein the auxiliary winding is asymmetric with respect to the primary winding to at least partially establish an admittance of the auxiliary winding being greater than an admittance of the primary winding.

4. The high-Q on-chip inductor of claim 3, wherein the asymmetry is achieved by at least one of: asymmetrical electromagnetic coupling between the primary winding and the auxiliary winding, asymmetrical number of turns between the primary winding and the auxiliary winding, and asymmetrical geometric configuration of the primary and auxiliary windings.

5. The high-Q on-chip inductor of claim 1, further comprises a poly-silicon shield operably coupled to the primary winding and to the auxiliary winding.

6. The high-Q on-chip inductor of claim 1 further comprises:
   the primary winding including a plurality of turns on multiple dielectric layers of an integrated circuit, wherein the plurality of turns are operably coupled via bridges on differing dielectric layers of the integrated circuit; and
   the auxiliary winding including at least one turn on at least one of the multiple dielectric layers of the integrated circuit.

7. The high-Q on-chip inductor of claim 1 further comprises:
   the primary winding including at least one turn on a first dielectric layer of an integrated circuit; and
   the auxiliary winding including at least one turn on a second dielectric layer of the integrated circuit, wherein the at least one turn of the primary winding is stacked with respect to the at least one turn of the auxiliary winding.

* * * * *

UNITED STATES PATENT AND TRADEMARK OFFICE
CERTIFICATE OF CORRECTION

| | | |
|---|---|---|
| PATENT NO. | : 7,236,080 B2 | Page 1 of 1 |
| APPLICATION NO. | : 10/944305 | |
| DATED | : June 26, 2007 | |
| INVENTOR(S) | : Sissy Kyriazidou et al. | |

It is certified that error appears in the above-identified patent and that said Letters Patent is hereby corrected as shown below:

Column 5, line 36, in Claim 2: replace "onchip" with --on-chip--.

Signed and Sealed this

Seventeenth Day of March, 2009

JOHN DOLL
*Acting Director of the United States Patent and Trademark Office*